(12) United States Patent
Korner

(10) Patent No.: US 10,756,722 B2
(45) Date of Patent: Aug. 25, 2020

(54) HYBRID SWITCH CONTROL

(71) Applicant: HELLA GmbH & Co. KGaA, Lippstadt (DE)

(72) Inventor: Andre Korner, Lippstadt (DE)

(*) Notice: Subject to any disclaimer, the term of this patent is extended or adjusted under 35 U.S.C. 154(b) by 0 days.

(21) Appl. No.: 16/490,697

(22) PCT Filed: Mar. 1, 2018

(86) PCT No.: PCT/IB2018/051316
§ 371 (c)(1),
(2) Date: Sep. 3, 2019

(87) PCT Pub. No.: WO2018/158726
PCT Pub. Date: Sep. 7, 2018

(65) Prior Publication Data
US 2019/0386652 A1 Dec. 19, 2019

Related U.S. Application Data

(60) Provisional application No. 62/466,326, filed on Mar. 2, 2017.

(51) Int. Cl.
*H03K 17/12* (2006.01)
(52) U.S. Cl.
CPC ... *H03K 17/127* (2013.01); *H03K 2217/0036* (2013.01)
(58) Field of Classification Search
CPC .................................................. H03K 17/127
USPC ................ 327/375, 108–112, 427, 434, 437; 326/82, 83, 87
See application file for complete search history.

(56) References Cited

U.S. PATENT DOCUMENTS

| | | | |
|---|---|---|---|
| 5,977,778 A * | 11/1999 | Chan | F15B 15/2815 324/635 |
| 6,430,071 B1 * | 8/2002 | Haneda | H02M 3/33592 363/127 |
| 2003/0038615 A1 | 2/2003 | Elbanhawy | |
| 2006/0221528 A1 * | 10/2006 | Li | H02M 3/156 361/100 |

(Continued)

OTHER PUBLICATIONS

International Search Report and Written Opinion of International Application No. PCT/IB2018/051316 (WO2018/158726) completed on May 7, 2018.

*Primary Examiner* — Tomi Skibinski
(74) *Attorney, Agent, or Firm* — Warner, Norcorss + Judd LLP

(57) ABSTRACT

A hybrid switch apparatus includes a standard semiconductor switch and a fast semiconductor switch electrically arranged in parallel to form a joint output current path for carrying a load current. The standard switch may be a silicon (Si) MOSFET while the fast switch may be a GaN high electron mobility transistor (HEMT). A means for producing first and second gate drive signals includes a pulse former. The first gate drive signal is applied the standard switch for selectively turning the standard switch on and off. The pulse former outputs the second gate drive signal for driving the fast switch, where the pulse former generates the second gate drive signal as a switch-on pulse starting synchronously with each transition of the first gate drive signal and which generates the second gate drive signal in an OFF state in between pulses to avoid incurring a conduction loss in the fast switch.

10 Claims, 7 Drawing Sheets

(56) References Cited

U.S. PATENT DOCUMENTS

| | | | |
|---|---|---|---|
| 2008/0069266 A1* | 3/2008 | Kuang | H04B 1/0475 375/295 |
| 2009/0230906 A1* | 9/2009 | Sardat | H03K 17/063 318/400.26 |
| 2011/0043244 A1* | 2/2011 | Hall | G01R 31/11 324/764.01 |
| 2013/0342262 A1* | 12/2013 | Konstantinov | H03K 17/164 327/375 |
| 2015/0338306 A1* | 11/2015 | Dunne | G01M 5/0033 73/587 |

* cited by examiner

HYBRID SWITCH CONTROL

CROSS-REFERENCE TO RELATED APPLICATIONS

This application claims the benefit of U.S. provisional application No. 62/466,326, filed 2 Mar. 2017 (the '326 application), which '326 application is hereby incorporated by reference as though fully set forth herein.

BACKGROUND a. Technical Field

The instant disclosure relates generally to power electronics systems, and more particularly to an apparatus for control of a hybrid switch that includes a first (fast) semiconductor switching device, such as a fast GaN high electron mobility transistor (HEMT), and a second (slower) semiconductor switching device, such as a silicon (Si) metal-oxide-semiconductor field-effect transistor (MOSFET).

b. Background

This background description is set forth below for the purpose of providing context only. Therefore, any aspects of this background description, to the extent that it does not otherwise qualify as prior art, is neither expressly nor impliedly admitted as prior art against the instant disclosure.

In a power electronics circuit, a high-current power capability can be provided by electrically connecting a plurality of semiconductor switches in a paralleled arrangement so as to permit the undertaking of the load current together. A paralleled arrangement is desirable because such a paralleled arrangement can collectively have a much lower conduction resistance as compared to a single switch. The reduced conduction resistance can reduce a conduction loss, which can increase an overall system efficiency. Silicon switches (e.g., MOSFET) are known for use in power applications; however, such switches are not operated at very high switching frequency due to relatively high switching losses.

Wide-bandgap (WBG) devices, such as Silicon Carbide (SiC) and Gallium Nitride (GaN) devices are becoming more popular due to their higher switching frequency capability, lower switching loss and higher thermal capability as compared to conventional silicon (Si) devices. However, WBG devices still have their own challenges.

First, its current capability compared to the Silicon devices is still not high enough for some applications. For such high-current applications, it is required to parallel multiple WBG switches, which increases the system cost. Second, particularly for a so-called GaN high electron mobility transistor (HEMT) device, its reverse conduction loss is much higher than, for example, a silicon MOSFET device when the switch is not "on". This reverse conduction loss characteristic limits system efficiency.

Additionally, the power rating of a WBG device will drive its cost so it would be desirable to reduce such power rating in order to reduce the cost of system including such WBG devices.

There is therefore a need to overcome one or more of the problems in the art.

The foregoing discussion is intended only to illustrate the present field and should not be taken as a disavowal of claim scope.

SUMMARY

In an embodiment, an apparatus is provided for selectively carrying a load current. The apparatus includes a first semiconductor switching device having a first control input for selectively turning the first switching device on and off and a second semiconductor switching device having a second control input for selectively turning the second switching device on and off. The first switching device has a first switching time that is greater than a second switching time associated with the second switching device (i.e., the second switching device switches faster). The apparatus further includes means for producing (i) a first control drive signal on a first drive output wherein said first control drive signal comprises an ON state and an OFF state, and (ii) a second control drive signal on a second drive output wherein said second control drive signal comprises an ON state and an OFF state.

The first and second switching devices are electrically connected in a parallel arrangement to form a joint output current path. The first control input of the first switching device is connected to the first drive output of the producing means to receive the first control drive signal. Also, the second control input of the second switching device is connected to the second drive output of the producing means to receive the second control drive signal.

The producing means includes a pulse former that is configured to generate (i) the second control drive signal as a first pulse when the first control drive signal transitions from the OFF state to the ON state; (ii) the second control drive signal as a second pulse when the first control drive signal transitions from the ON state to the OFF state; and (iii) the second control drive signal in the OFF state between the first and second pulses.

Through the foregoing, a conduction loss that would otherwise be incurred by the second switching device (i.e., the fast switching device) is avoided, which allows for use of a lower power rating for the second switching device to thereby reduce the overall cost of the hybrid switch.

The foregoing and other aspects, features, details, utilities, and advantages of the present disclosure will be apparent from reading the following description and claims, and from reviewing the accompanying drawings.

DETAILED DESCRIPTION

Figure 1:
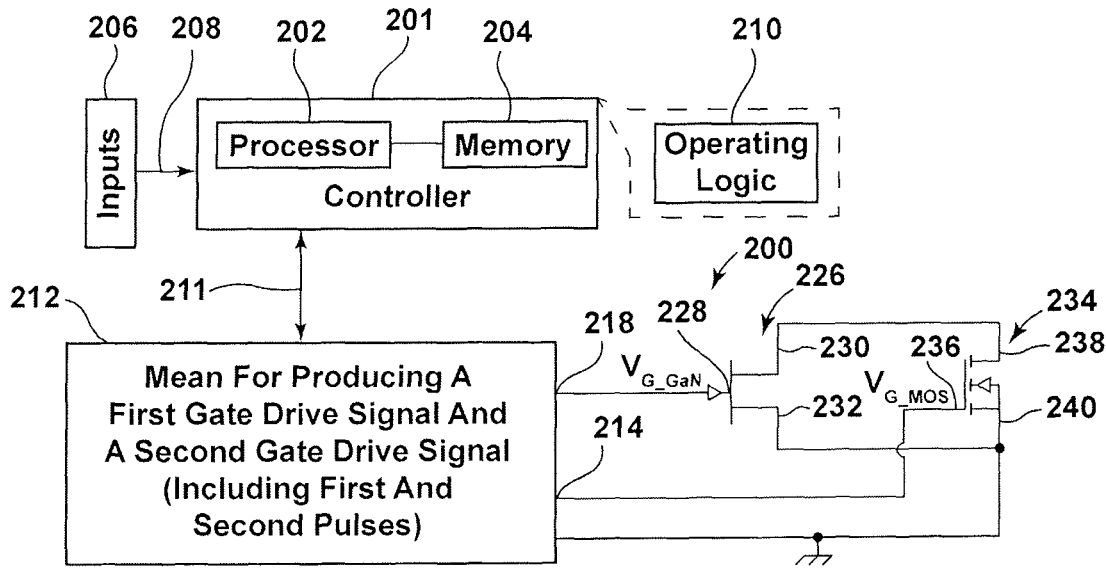
FIG. 1 is a schematic and block diagram of an apparatus with paralleled fast and slow semiconductor switching devices forming a hybrid switch and a control circuit for producing first and second drive signals therefore according to an embodiment.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments, the scope of which is defined solely by the appended claims.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

FIGS. 1-3D show an embodiment of a control circuit and method for operating a hybrid switch. The instant disclosure also describes an embodiment of a hybrid switch (and its control) in connection with FIGS. 4-10 wherein this latter embodiment utilizes a fast switchable wide-bandgap (WBG) switch such as a GaN HEMT paralleled with a relatively slower switching, but perhaps less expensive and possibly greater power capability, standard switch, such as a Silicon (Si) power MOSFET. The cost of the more expensive fast switch corresponds in part to its required power rating. In turn, the required power rating of the expensive fast switch (e.g., the WBG switch) is a result of its combined switching losses and conduction losses during operation. It should be understood, however, that if the necessary power rating of the expensive, fast switch can be reduced, this would reduce the cost of the more expensive fast switch, which in would reduce the overall cost of the hybrid switch.

In general, in the embodiment of FIGS. 4-10, the switching control is configured so that the fast switch not only does all the switching work but also contributes to the conduction of current. This is achieved by switching "on" the fast switch a little bit ahead of the slow switch and "off" a little bit behind it.

Thus, the expensive high speed WBG switch is burdened not only with the switching power dissipation, but also with conduction losses during the "on" time, creating additional power dissipation. The "on" time depends on the modulation, what basically results from the required (overall) power transmission of the hybrid switch. On the other hand, however, it should be appreciated that the conduction of current may be handled more cost-efficiently by the slower Silicon semiconductors switch(es), which constitute the second part of the hybrid switch. It should also be appreciated that the start or beginning of the transition of the fast switch gate drive signal may be synchronous with the start or transition of the standard switch gate drive signal because in this case, the fast switch will always start its output transition before the standard switch. As will be described, this observation can be used to implement simplified gate drive circuitry.

According to a control scheme of the embodiment of FIGS. 1-3D, the fast switch is switched "off" during most of the conduction period of the hybrid switch, and the pulses (e.g., gate drive signal) to control this behavior of the fast switch are synchronous with the transitions of the control pulse (e.g., gate drive signal) for the standard switch. Therefore, in the embodiment of FIGS. 1-3D, the fast switch is switched "on" only for a relatively short duration for both the switching "on" and "off" of the hybrid switch, and is switched "off" both for the isolation time and for most of the conduction time of the hybrid switch. In an embodiment of FIGS. 1-3D, the "on" times of the fast switch might be extended partly into the "on" time of the hybrid switch for optimized load balancing of the fast and the slow switches.

Figure 5:
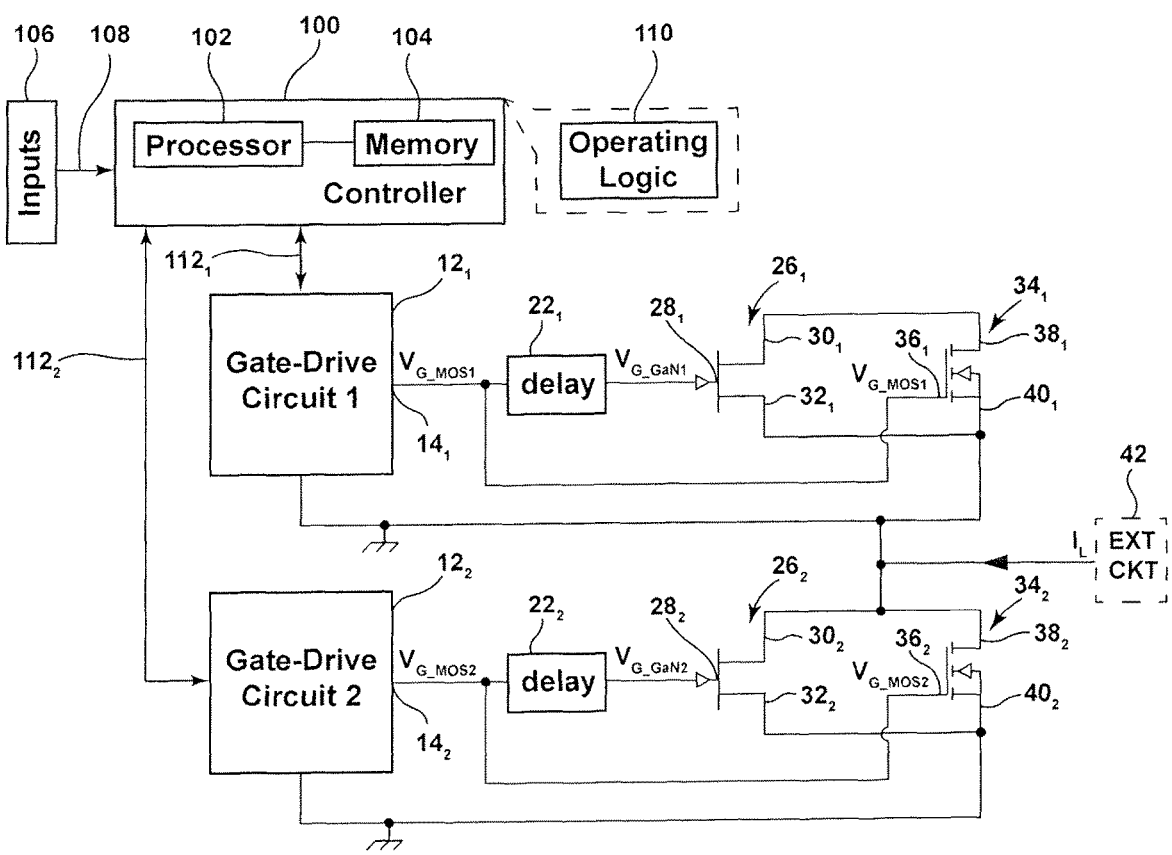
FIG. 5 is a schematic diagram of an alternate embodiment using a replication of the arrangement of FIG. 4.

Referring now to the drawings wherein like reference numerals are used to identify identical or similar components in the various views, FIG. 1 is a schematic and block diagram view of an embodiment of a hybrid switch apparatus 200. Apparatus 200 comprises a paralleled switch arrangement suitable for use in a power electronics system. The embodiment of FIG. 1 may be considered a single switch arrangement that can be replicated for use in larger constructs, such as shown in FIG. 5 in the application of a bridge, to be connected with respect to a load(s) and/or power source in a variety of ways known in the art.

Figure 2:
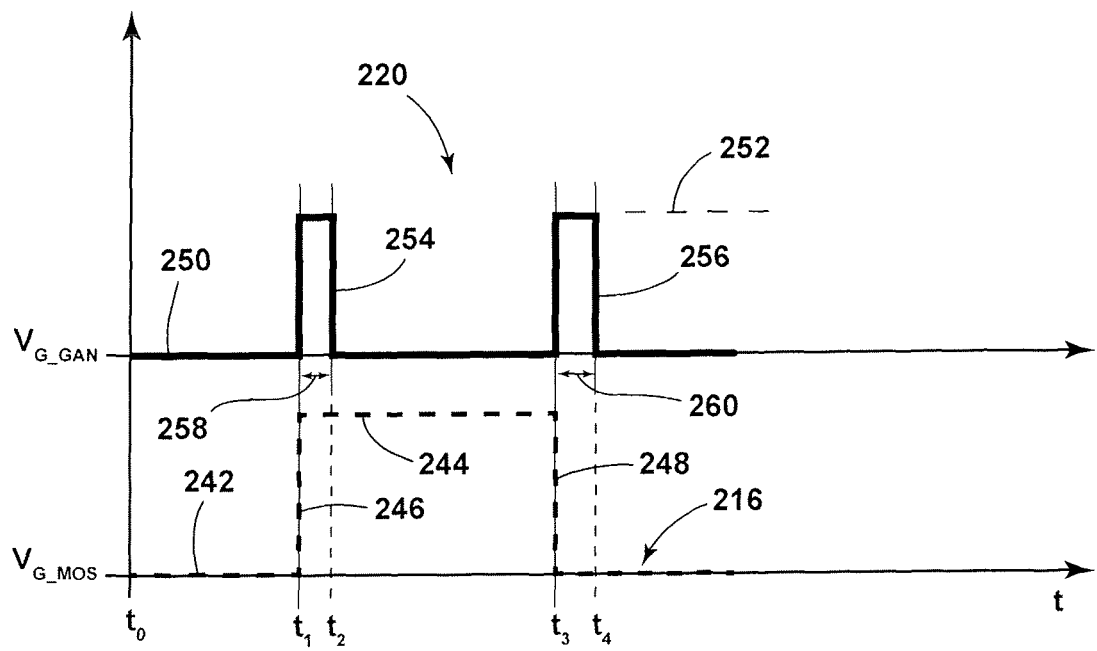
FIG. 2 is a simplified timing diagram showing the first and second gate drive signals for the hybrid switch embodiment of FIG. 1.

In the illustrated embodiment, apparatus 200 includes means 212 for producing the gate drive signals for the standard switch and the fast switch including the above-mentioned pulses. In an embodiment, the means 212 is provided for producing (i) a first gate drive signal 216 (e.g., $V_{G\_Mos}$—FIG. 2) on a first gate drive output 214 wherein the first gate drive signal 216 comprises an OFF state 242 (FIG. 2) and an ON state 244 (FIG. 2). In an embodiment, the ON state 244, when asserted by the producing means 212, is configured to turn on the target switch (e.g., switch 234), while the OFF state 242 (de-asserted) is conversely configured to turn off the target switch.

The producing means 212 further produces a second gate drive signal 220 (e.g., $V_{G\_GAN}$—FIG. 2) on a second gate drive output 218 wherein the second gate drive signal 220 comprises an OFF state 250 (FIG. 2) and an ON state 252 (FIG. 2). Likewise, in an embodiment, the ON state 252, when asserted by the producing means 212, is configured to turn on the target switch (e.g., switch 226), while the OFF state 250 (de-asserted) is conversely configured to turn off the target switch.

The producing means 212 also includes a pulse former 262, 262a (best shown in FIGS. 3A-3D) that is configured to generate the above-mentioned pulses. In particular, the pulse former, as best shown in FIG. 2, is configured to generate (i) the second gate drive signal 220 as a first pulse 254 when the first gate drive signal 216 transitions from the OFF state 242 to the ON state 244; (ii) the second gate drive signal 220 as a second pulse 256 when the first gate drive signal 216 transitions from the ON state 244 to the OFF state 242; and (iii) the second gate drive signal 220 in the OFF state 250 in between the first and second pulses 254, 256. By turning off the fast switch between pulses, the conduction loss incurred by the fast switch is substantially reduced, thereby allowing for the use of a fast switch with a substantially lower power rating, resulting in a corresponding reduction in cost.

With continued reference to FIG. 1, the apparatus 200 may include an electronic control unit (ECU) or controller 201 that is configured to implement a desired control strategy for the operation of hybrid switch apparatus 200. The controller 201 includes an electronic processor 202 and a memory 204. The processor 202 may include processing capabilities as well as an input/output (I/O) interface through which processor 202 may receive a plurality of input signals (input block 206 providing input signal(s) 208) and generate a plurality of output signals (e.g., gate control commands 211 to producing means 212). The memory 204 is provided for storage of data and instructions or code (i.e., software) for processor 202.

Memory 204 may include various forms of non-volatile (i.e., non-transitory) memory including flash memory or read only memory (ROM) including various forms of programmable read only memory (e.g., PROM, EPROM, EEPROM) and/or volatile memory including random access memory (RAM) including static random access memory (SRAM), dynamic random access memory (DRAM) and synchronous dynamic random access memory (SDRAM).

In an embodiment, control of the switching of the hybrid switch apparatus 100 may be conducted according to execution of predetermined operating control logic 210, which comprises processor instructions that can be stored in memory 204 and are configured to be executed by processor 202. Alternatively, the operating control logic 210 for controlling the operation of the hybrid switch apparatus 200 (i.e., turn-off and turn-on control) can be implemented in hardware. As shown, the controller 201 may produce control signals 211 that controls the means 212 for producing the gate drive signals described herein (see FIG. 2 for timing diagram). The art is replete with teachings for implementing general switching control strategies.

The hybrid switch apparatus 200 further includes a first, standard semiconductor switching device 234 and a second, fast semiconductor switching device 226, which are two signal-controllable switches that are connected in parallel to form a joint output current path. The first, standard switching device may include one or more silicon switches, such as a silicon (Si) metal-oxide-semiconductor field-effect transistor (MOSFET), a silicon (Si) insulated gate bipolar transistor (IGBT) or any other controllable switching device. In the illustrated embodiment of FIG. 1, the first, standard switching device comprises a Si MOSFET 234 that includes a gate 236, a drain 238, and a source 240. In an embodiment, the Si MOSFET 234 may comprise commercially available components, for example, an N-Channel power MOSFET provided under the trade designation and/or part number STY139N65M5 from STMicroelectronics, Coppell, Tex., USA.

The second, fast semiconductor switching device 226 may include a fast silicon power MOSFET device (i.e., a silicon semiconductor switch with a turn-on and/or turn off time that is less than the respective turn-on/turn-off time of the first semiconductor switching device 234), or a wide-bandgap (WBG) device including a GaN high electron mobility transistor (HEMT) device, a GaN cascode switch device, a SiC switch device, or any other GaN based switching device. In an embodiment, the fast switching device 226 may be a wide-bandgap (WBG) switch device, such as a GaN high electron mobility transistor (HEMT) that includes a gate 228, a drain 230, and a source 232. In an embodiment, the GaN HEMT switch 226 may comprise commercially available components, for example, an enhancement mode GaN transistor provided under the trade designation and/or part number GS66516T from GaN Systems Corp., Ann Arbor, Mich., USA.

The first and second switching devices 234, 226 are electrically connected in a parallel arrangement to each other, wherein (i) the drain 230 and the drain 238 are electrically connected and (ii) the source 232 and the source 240 are also electrically connected. As shown in FIG. 1, the gate 236 of the standard switch 234 is electrically connected to the output 214 of the producing means 212 in order to receive the gate drive signal 216 ($V_{G\_MOS}$) while the gate 228 of the fast switch 226 is electrically connected to the output 218 of the producing means 212 in order to receive the gate drive signal 220 ($V_{G\_GAN}$).

Figure 3A:
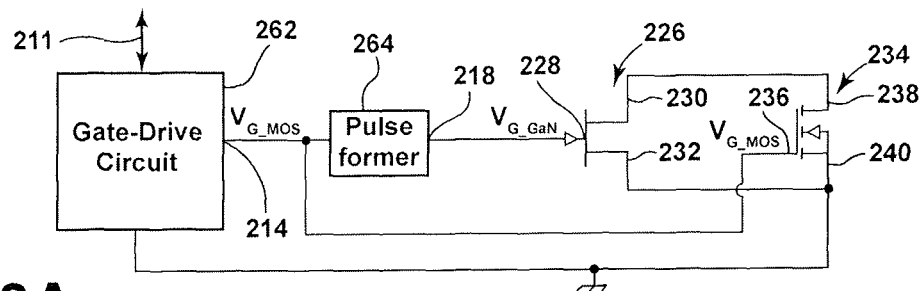
FIGS. 3A-3D are schematic and block diagrams of further embodiments of the control circuit of FIG. 1 for producing the first and second gate drive signals.
Figure 3B:
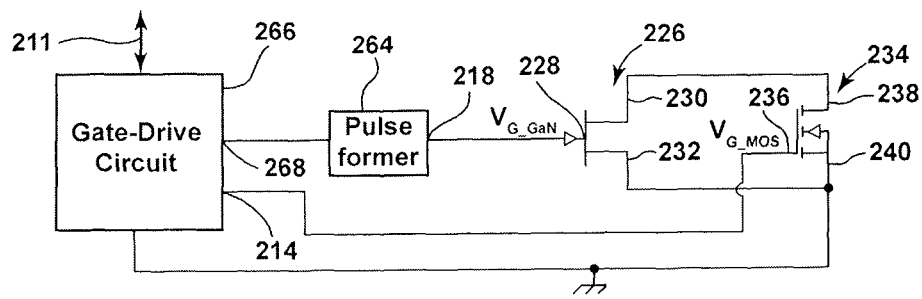

FIGS. 3A-3B are simplified schematic and block diagrams showing embodiments of the means 212 for producing the first and second gate drive signals 216 and 220 which are shown in FIG. 2. As described above, the fast switch is switched "on" only for a relatively short duration for both the switching "on" and "off" of the hybrid switch, and is switched "off" both for the isolation time and for most of the conduction time of the hybrid switch. FIGS. 3A-3B shown a number of embodiments to implement this control scheme.

In the embodiment of FIG. 3A, the means 212 for producing the gate drive signals 216, 220 includes a gate drive circuit 262 and a pulse former 264. The gate drive circuit 262 has the gate drive signal output 214 and provides direct control over the operation of the standard switch 234. The pulse former 264 is configured to generate the pulses 254, 256 (FIG. 2) as described above which drive the fast switch 226 as well as the intervening OFF period between pulses. The gate drive circuit 262 may comprise a semiconductor chip and further be configured to respond to a variety of input signals (e.g., voltage and/or current inputs) in order to output, among other things, the gate drive signal 216 at output 214. In an embodiment, the gate drive circuit 262 may comprise conventional devices commercially available in the art, for example, known MOSFET/GaN gate drive integrated circuits ("chip"). In the illustrated embodiment, for GaN HEMT devices, the gate drive circuit 262 may comprise a Half-Bridge Gate Driver for Enhancement Mode GaN FETs gate drive circuit, model no. LM5113, commercially available from Texas Instruments, Dallas, Tex., U.S.A. In an embodiment, the gate drive signal 216, also sometimes designated $V_{G\_MOS}$ herein, may have its output voltage $V_{G\_MOS}$ ranging between about +7 V for the ON state 18 to −5 V for the OFF state 20. The pulse former 264 may comprise conventional apparatus known in the art.

In the embodiment of FIG. 3B, the means 212 for producing the gate drive signals 216, 220 includes the gate drive circuit 262 and the pulse former 264 as described above, but where the gate drive circuit 262 includes a further, second gate drive output, which as shown includes not only the above-mentioned first gate drive output 214 but in addition also includes a further output 268 producing a control signal that corresponds to the first gate drive signal provided to the standard switch 234. The control signal is provided to the pulse former 264 which produces the second gate drive signal 220 (including the pulses 254, 256). In the embodiment of FIG. 3B, the pulse former 264 is a physically separate component from the gate drive circuit 262, just as it is in the embodiment of FIG. 3A.

Figure 3C:
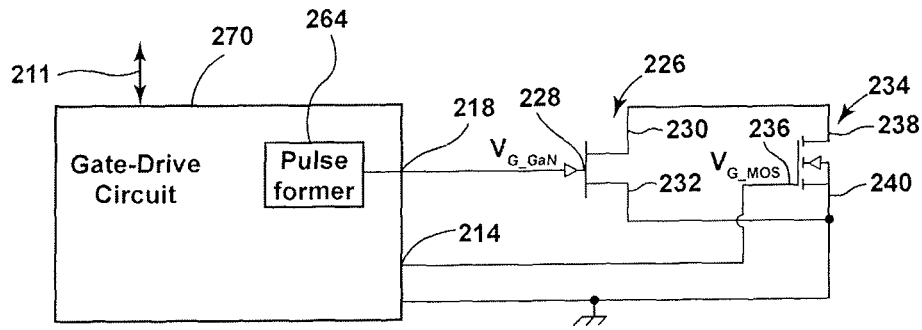

In the embodiment of FIG. 3C, the means 212 for producing the gate drive signals 216, 220 includes a gate drive circuit 270 and the pulse former 264 as described above in connection with FIG. 3B, but where the pulse former 264 is included inside of the gate drive circuit 270. The gate drive circuit 270 is otherwise similar to gate drive circuit 262. In the embodiment of FIG. 3C, the gate drive circuit 270 directly outputs the second gate drive signal 220 on output 218.

Figure 3D:
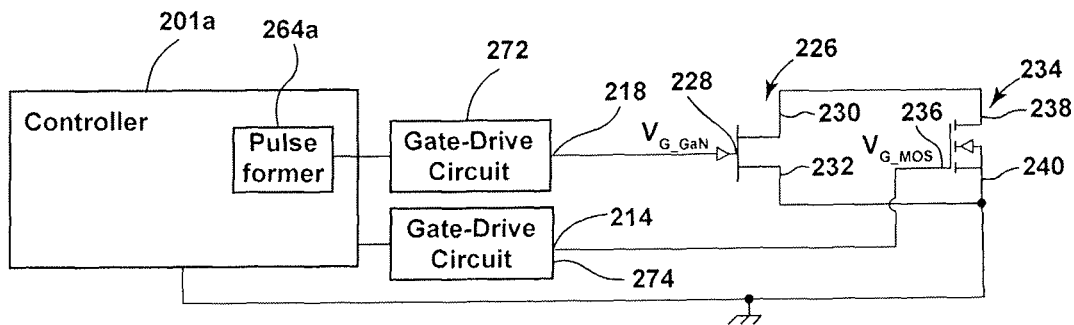

In the embodiment of FIG. 3D, the means 212 for producing the gate drive signals 216, 220 includes the controller 201a, which is similar to controller 201 except that controller 201a includes a pulse former 264a inside. The pulse former 264a is otherwise similar to the pulse former 264. The embodiment of FIG. 3D further includes individual gate drive circuits 272 and 274, which are similar to gate drive circuit 262 described above. In the embodiment of FIG. 3D, the first gate drive signal 216 to the standard switch 234 is output from the gate drive circuit 274 while the second gate drive signal 220 to the fast switch 226 is output from the gate drive circuit 272.

Referring again to FIG. 2, in operation, between time $t_0$ and time $t_1$, both of the first and second gate drive signals 216, 220 are in the OFF state wherein both the standard switch 234 and the fast switch 226 are also OFF.

At time $t_1$, the first gate drive signal 216 transitions from the OFF state 242 to the ON state 244. As described above, the pulse former 264, in embodiments, generates a switch-on pulse, for example, the pulse 254, starting synchronously with the above mentioned OFF-to-ON transition of the first gate drive signal 216. The pulse 254, associated with the OFF-to-ON transition, has a first predetermined duration 258 and is effective to turn on the fast switch 226. After the duration of the pulse 254, the second control signal 220 transitions ON-to-OFF at time $t_2$, thereby effective to turn off the fast switch 226.

Between time $t_2$ and time $t_3$, the first gate drive signal 216 remains in the ON state 244 thereby keeping the standard switch on, which operates to carry the load current. However, between time $t_2$ and time $t_3$, the second gate drive signal 220 remain in the OFF state 250, thereby effective to keep the fast switch 226 in the off state. Thus, while the standard switch 234 carries the load current, the fast switch 234 remains OFF, which is effective to eliminate the conduction loss incurred by the fast switch 226 during the period between time $t_2$ and time $t_3$.

At time $t_3$, the first gate drive signal 216 transitions ON-to-OFF. Since the pulse former 264 (in embodiments) operates to produce a pulse at every status transition of the first gate drive signal 216, whether it be the low-high (OFF-ON) transition or the high-low (ON-OFF) transition, the pulse former thereby produces another pulse, namely, pulse 256. This second pulse 256 has a second predetermined duration 260 and is effective to turn on the fast switch 226 in order to carry load current while the standard switch 234 is being turned off.

In an alternate embodiments, the respective durations 258 and 260 of the two pulses 254 and 256 may be different or equal. For example, the duration 260 of the pulse 256 generated from the high-low (ON-OFF) transition may be set to be longer than duration 258, if the switch-off transition of the standard switch 234 takes longer than its switch-on transition. Additionally, the respective durations of the two pulses 254, 256 may be pre-set in a way that the fast switch 226 is at least switched "on" for the time of the switch-on transition of the standard switch 234 output, and the fast switch 226 is also on at least for the time of the switch-off transition of the standard switch 234 output. As described above, in between these pulses, the fast switch 226 will be switched "off", whenever there is any time between its first on time and its second on pulse.

In a further embodiment, the control input of both the fast and the standard switch might have an additional gate resistor (not shown) in between the control input leading to it and the switch device control input (e.g., gate, base), in all described cases.

FIGS. 4-10 show an embodiment of a hybrid switch, substantially as set forth in U.S. application Ser. No. 15/261,051, filed 9 Sep. 2016 (the '051 application), entitled "HYBRID SWITCH INCLUDING GaN HEMT AND MOSFET", the '051 application being hereby incorporated by reference as though fully set forth herein. Present approaches that use silicon switching devices (e.g., MOSFETs) typically are not operated a very high switching frequencies due to relatively high switching losses, while present approaches that use GaN HEMTs have a relatively larger forward/reverse conduction loss. An apparatus according to the present teachings parallels a wide-bandgap device (e.g., GaN HEMT) to a silicon switch (e.g., Si MOSFET) at zero voltage switching (ZVS) turn-on applications. Generally, the switching frequency of the apparatus will be much higher than for silicon switch only systems since the turn-off loss of, for example, GaN HEMT is substantially negligible. Additionally, the conduction loss is for the most part undertaken by the, for example, Si MOSFET switch. In an alternate embodiment, further Si MOSFET switches can be paralleled together in order to further drop the conduction loss, and will not significantly increase the system cost. An embodiment according to the instant teachings provides an economic solution without sacrificing the high frequency switching performance of GaN HEMT devices as well as facilitate design of a high-efficiency, high-power-density and low cost power electronics system.

An apparatus according to an embodiment of the instant disclosure includes a gate drive circuit having at least one gate drive output configured to produce a gate drive signal thereon, a wide-bandgap switching device, for example, a high electron mobility transistor (HEMT) where the HEMT has a first gate, a first drain, and a first source. The apparatus further includes a semiconductor switch having a second gate, a second drain, and a second source. The HEMT and the semiconductor switch are connected in a parallel arrangement wherein (i) the first drain and the second drain are electrically connected and (ii) the first source and the second source are electrically connected. The second gate is connected to the gate drive circuit output to receive the gate drive signal. The apparatus further includes a delay block having an input connected to the gate drive circuit output and an output configured to produce a delayed gate drive signal. The first gate of the HEMT is connected to the delay block output to receive the delayed gate drive signal. A method of operation is also presented.

Switching losses. As described above, silicon switches (e.g., MOSFETs) generally experienced switching losses when, for example, they are switched off. As will be described below in greater detail, the Si MOSFET will be switched off while the GaN HEMT is still on—due to a time delay inserted into the respective gate drive signals. Accordingly, there is no switching losses for the Si MOSFETs.

Reverse conduction loss. A so-called reverse conduction loss for GaN HEMT devices was described above. By way of explanation, the GaN HEMT devices, because of the absence of the body diode, will have a reverse conduction mode that is different from Si MOSFETs. In particular, when $V_{gd}$ is higher than a reverse threshold voltage $V_{th\_gd}$, the two-dimensional electron gas (2 DEG) of GaN HEMTs conducts the current with the voltage drop as shown in equation (1).

$$Vsd = Vth\_gd - Vgs\_off + id*Rdson \quad (1)$$

In order to prevent a potential shoot-through in a bridge circuit, a negative $V_{gs\_off}$ is always preferred to turn off GaN HEMT switches, which however increases the dead-band loss. For example, for the 650V/60V GaN HEMT provided by GaN Systems Inc, the $V_{th\_gd}=2V$. When $V_{gs\_off}=-5V$ to turn off the GaN HEMT switch, which is typical for normal for Si or SiC MOSFETs, the reverse voltage drop of the GaN HEMT will be at least 7V (e.g., as per equation (1)). To solve such issue of undue reverse conduction loss, options could include either reducing $V_{gs\_off}$ to zero, or alternatively to shrink the deadband (i.e., to shorten the time when the GaN HEMT switch is OFF). Both of these options may impair the proper operation of the system.

To more fully utilize the merits of GaN HEMT switches and avoid its relatively large reverse conduction loss, accordingly to the teachings of the instant application, a hybrid switch is provided which uses a GaN HEMT switch paralleled with a Si MOSFET switch. As will be described below, such a hybrid switch apparatus overcomes the reverse conduction loss in the GaN HEMT switch while also overcoming switching losses in a Si MOSFET switch, when used in zero-voltage-switching (ZVS) turn-on applications.

Figure 4:
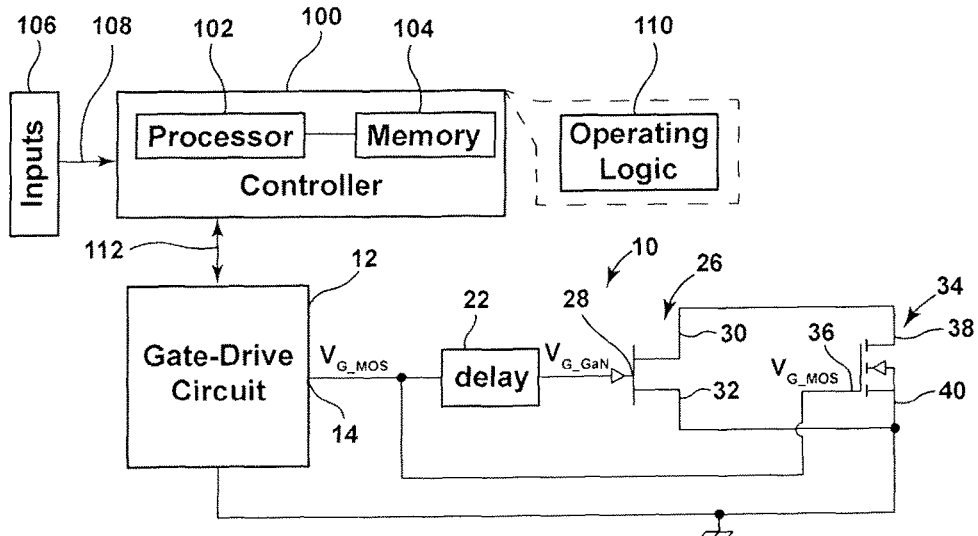
FIG. 4 is diagrammatic schematic and block diagram of an apparatus with paralleled transistors according to an embodiment of the instant disclosure.

Referring now to the drawings wherein like reference numerals are used to identify identical or similar components in the various views, FIG. 4 is a diagrammatic view of an embodiment of a hybrid switch apparatus 10. Apparatus 10 comprises a paralleled switch arrangement suitable for use in a power electronics system. The embodiment of FIG. 4 may be considered a single switch arrangement that can be replicated for use in larger constructs, such as shown in FIG. 5 in the application of a bridge, to be connected with respect to a load(s) and/or power source in a variety of ways known in the art.

In the illustrated embodiment, apparatus 10 includes a gate drive circuit 12 having at least one gate drive circuit output 14. The gate drive circuit 12 may comprise a semiconductor chip and further be configured to respond to a variety of input signals (e.g., voltage and/or current inputs) in order to output, among other things, a gate drive signal 16 (best shown in FIG. 6) at the gate drive circuit output 14. In particular, the gate drive circuit 12 may produce the gate drive signal 16 in accordance with a predetermined control approach. The art is replete with exemplary control strategies, and is dependent on the particular application. Alternatively, the processing needed to produce a gate drive signal may be performed by, an electronic control unit (ECU) as described below in greater detail.

Figure 6:
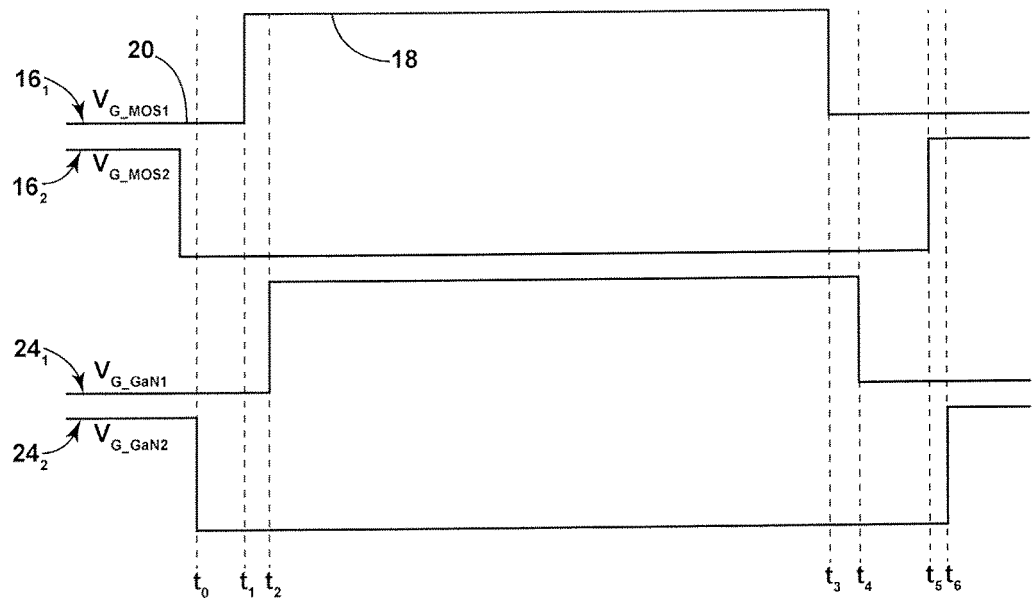
FIG. 6 illustrates simplified timing diagrams of a gate drive signal and a delayed gate drive signal reflecting the operation of the embodiment of FIG. 5.

As shown in FIG. 6, the gate drive signal 16 includes at least an ON state 18 and an OFF state 20. In an embodiment, the ON state 18, when asserted by the gate drive circuit 12, is configured to turn on the target switch, while the OFF state 20, when asserted, is conversely configured to turn off the target switch.

In an embodiment, the gate drive circuit 12 may comprise conventional apparatus commercially available in the art, for example, known MOSFET/GaN gate drive integrated circuits ("chip"). In the illustrated embodiment, for GaN HEMT devices, the gate drive circuit 12 may comprise a Half-Bridge Gate Driver for Enhancement Mode GaN FETs gate drive circuit (e.g., as in FIG. 5), model no. LM5113, commercially available from Texas Instruments, Dallas, Tex., U.S.A. In an embodiment, the gate drive signal 16, also sometimes designated $V_{G\_MOS}$ herein, may have its output voltage $V_{G\_MOS}$ ranging between about +7 V for the ON state 18 to −5 V for the OFF state 20.

While FIG. 4 shows a gate drive circuit 12, which can be a specific control device, apparatus 10 may additionally include, or may have as a substitute for the gate drive circuit 12, an electronic control unit (ECU) 100 that is configured to implement a desired control strategy for the operation of hybrid switch apparatus 10. ECU 100 includes a processor 102 and a memory 104. The processor 102 may include processing capabilities as well as an input/output (I/O) interface through which processor 102 may receive a plurality of input signals (input block 106 providing input signal(s) 108) and generate a plurality of output signals (e.g., gate drive signal(s), in an embodiment). Memory 104 is provided for storage of data and instructions or code (i.e., software) for processor 102.

Memory 104 may include various forms of non-volatile (i.e., non-transitory) memory including flash memory or read only memory (ROM) including various forms of programmable read only memory (e.g., PROM, EPROM, EEPROM) and/or volatile memory including random access memory (RAM) including static random access memory (SRAM), dynamic random access memory (DRAM) and synchronous dynamic random access memory (SDRAM).

In an embodiment, one approach for switching device turn-on control may be to employ a zero voltage switching (ZVS) strategy. As shown, the control strategy for turn-off control and turn-on control (including the ZVS control) can be implemented in terms of operating control logic 110, which comprises processor instructions that can be stored in memory 104 and are configured to be executed by processor 102. Alternatively, the operational control logic for controlling the operation of the hybrid switch apparatus 10 (i.e., turn-off and turn-on control) can be implemented in hardware. As shown, the ECU 100 may produce a control signal 112 that controls the gate drive circuit 12 to assert and de-assert the gate drive signal 16 (see FIG. 6 for timing diagram). The art is replete with teachings for implementing a zero voltage switching (ZVS) control strategy. Generally, in order to maintain zero voltage switching for switch turn-on, before the turning on action, current should reverse flow, which makes the switch voltage drop to zero. Thus, during the switch turn on, the switch only undertakes the current change with a voltage then-prevailing thereacross always being close to be zero, which in turn eliminates the turn-on loss to thereby reach the ZVS turn on. Further information may be seen by reference to U.S. application Ser. No. 14/744,988, filed 19 Jun. 2015 (the '988 application) entitled "GATE DRIVE CIRCUIT". The '988 application is hereby incorporated by reference as though fully set forth herein.

With continued reference to FIG. 4, hybrid switch apparatus 10 further includes a wide-bandgap switch, such as a GaN high electron mobility transistor (HEMT) 26 which includes a first gate 28, a first drain 30, and a first source 32. In an embodiment, the GaN HEMT switch 26 may comprise commercially available components, for example, an enhancement mode GaN transistor provided under the trade designation and/or part number GS66516T from GaN Systems Corp., Ann Arbor, Mich., USA.

The hybrid switch apparatus 10 further includes one or more silicon switches, such as a silicon (Si) metal-oxide-semiconductor field-effect transistor (MOSFET) 34 which includes a second gate 36, a second drain 38, and a second source 40. In an embodiment, the MOSFET 34 may comprise commercially available components, for example, an N-Channel power MOSFET provided under the trade designation and/or part number STY139N65M5 from STMicroelectronics, Coppell, Tex., USA.

The GaN HEMT 26 and the Si MOSFET 34 are electrically connected in a parallel arrangement to each other, wherein (i) the first drain 30 and the second drain 38 are electrically connected and (ii) the first source 32 and the second source 40 are also electrically connected. As shown in FIG. 4, the second gate 36 is electrically connected to the gate drive circuit output 14 in order to receive the gate drive signal 16 ($V_{G\_MOS}$).

The hybrid switch apparatus 10 still further includes a delay block 22 having an input connected to the gate drive circuit output 14, which input is configured to receive the gate drive signal 16 ($V_{G\_MOS}$). The delay block 22 further includes an output configured to produce a delayed gate drive signal, which is designated $V_{G\_GaN}$. The first gate 28 of the GaN HEMT 26 is electrically connected to the output of the delay block 22 in order to receive the delayed gate drive signal ($V_{G\_GaN}$). As alluded to, the delay block 22 operates to insert a time delay between the gate signals of two switches 26, 34. In an embodiment, the delay block 22 may comprise a resistor-capacitor (RC) circuit of conventional design. In an embodiment, the delay block 22 may be configured to insert a time delay of not larger than about 100 nanoseconds (ns).

FIG. 5 shows how the hybrid switch apparatus 10 may be used as part of a bridge circuit (see external circuit 42). It should be understood that the hybrid switch apparatus 10 may be used in other applications, such as, for example, a half-bridge, an H-bridge, a three-phase inverter, and the like. In this regard, as shown, the hybrid switch arrangement in the apparatus 10 of FIG. 4 is replicated, where an "upper" switch contains the same components as in the embodiment of FIG. 4 where its reference numerals include a subscript "1" while the "lower" switch contains the same components as in the embodiment of FIG. 4 where its reference numerals include a subscript "2". The source terminal of the "upper" switch, namely, the source terminals $32_1$ and $40_1$, are electrically connected, at a common node 44, to the drain terminal of the "lower" switch, namely drain terminals $30_2$ and $38_2$. As further shown, the electronic control unit 100 is configured to generate control signals $112_1$ and $112_2$ for controlling operation of the "upper" and "lower" hybrid switch apparatus, respectively.

FIG. 6 is a timing diagram of the of the gate drive signals and delayed gate drive signals applicable to the embodiment of FIG. 5. In particular, the time sequence of the gate drive signals $16_1$, $16_2$ (also shown as signals $V_{G\_MOS1}$ and $V_{G\_MOS2}$) are shown on a common time-line, as well as the corresponding delayed gate drive signals $24_1$, $24_2$ (also shown as signals $V_{G\_GaN1}$ and $V_{G\_GaN2}$).

With reference now to FIGS. 7-10, a description of the operation of the embodiment of FIG. 5 according to the signal timing shown in FIG. 6 will now be set forth. Specifically, the operation of the embodiment of FIG. 5 can be broken down in to six separate time periods or modes.

Figure 7:
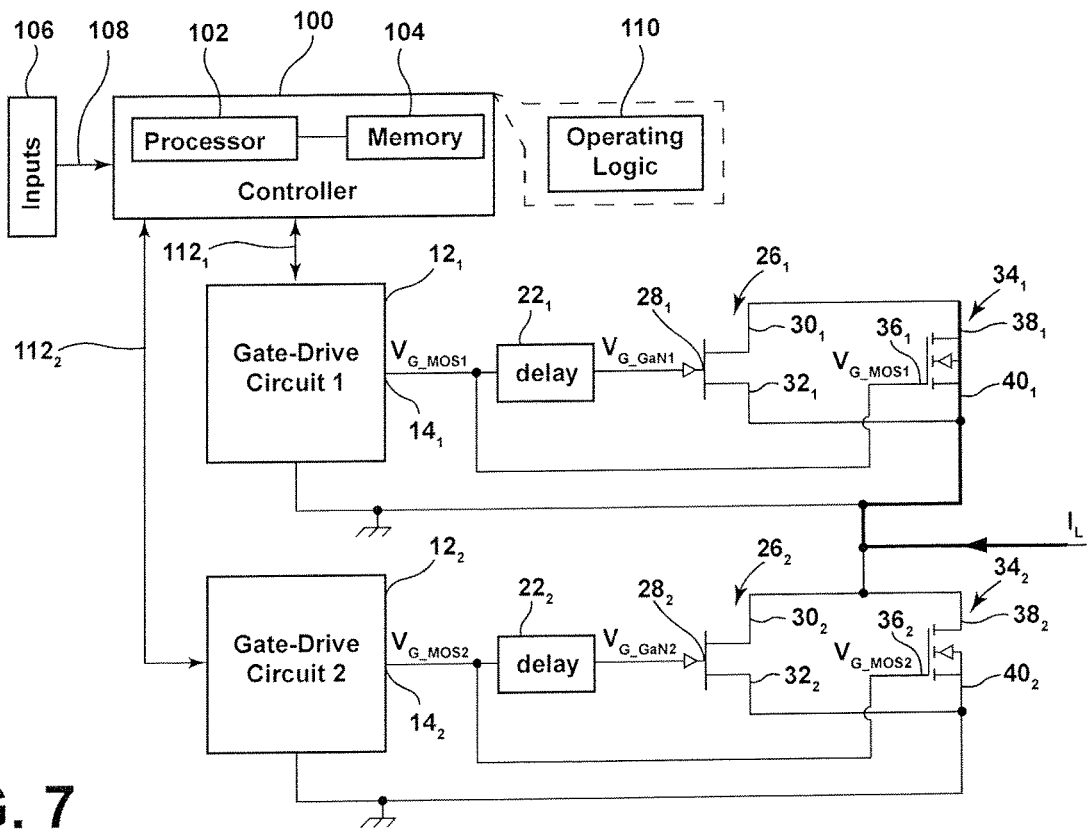
FIGS. 7-10 are schematic diagrams of the embodiment of FIG. 5 showing different modes of operation.

Mode 1: [$t_0$, $t_1$]. During the time period between times $t_0$, $t_1$, all of the switches are off (i.e., switches $26_1$, $34_1$, $26_2$, $34_2$). This is because all the gate drive signals are de-asserted and are in the OFF state. In an exemplary zero voltage switching (ZVS) application, the current $I_L$ shown in FIG. 5 will be taken to be positive—this is shown in FIG. 7. Therefore, the current $I_L$ will flow through the "upper" switch comprising GaN HEMT $26_1$ and Si MOSFET $34_1$. However, since the GaN HEMT $26_1$ exhibits a roughly 7V drop—as described above in connection with equation (1)—as compared to the only roughly 1~2V voltage drop of the body diode of Si MOSFET $34_1$, the current $I_L$ will flow through the body diode of Si MOSFET $34_1$, as shown in FIG. 7.

Mode 2: [$t_1$, $t_2$]. During the time period between times $t_1$, $t_2$, the upper Si MOSFET $34_1$ is on, while the other switches remain off (i.e., the other switches $26_1$, $26_2$, $34_2$ remain off). This is because (i) notwithstanding the assertion of the gate drive signal $16_1$ ($V_{G\_MOS1}$), the delay block 22 has time delayed the corresponding assertion of the gate drive signal $24_1$ ($V_{G\_GaN1}$); and (ii) the gate drive signals $16_2$, $24_2$ ($V_{G\_MOS2}$, $V_{G\_GaN2}$) are also both in the OFF state. ZVS application means that the current $I_L$ shown in FIG. 5 is positive—as also shown in FIG. 7. Therefore, the current $I_L$ will flow through the upper Si MOSFET $34_1$ channel. Since the GaN HEMT $26_1$ exhibits a roughly 7V drop in this example (see above in connection with Equation (1))—as compared to the much smaller voltage drop across the channel of the Si MOSFET $34_1$ (i.e., the MOSFET channel voltage drop is much smaller due to a small resistance—is ~mΩ), the current $I_L$ will flow through the Si MOSFET $34_1$ channel.

Figure 8:
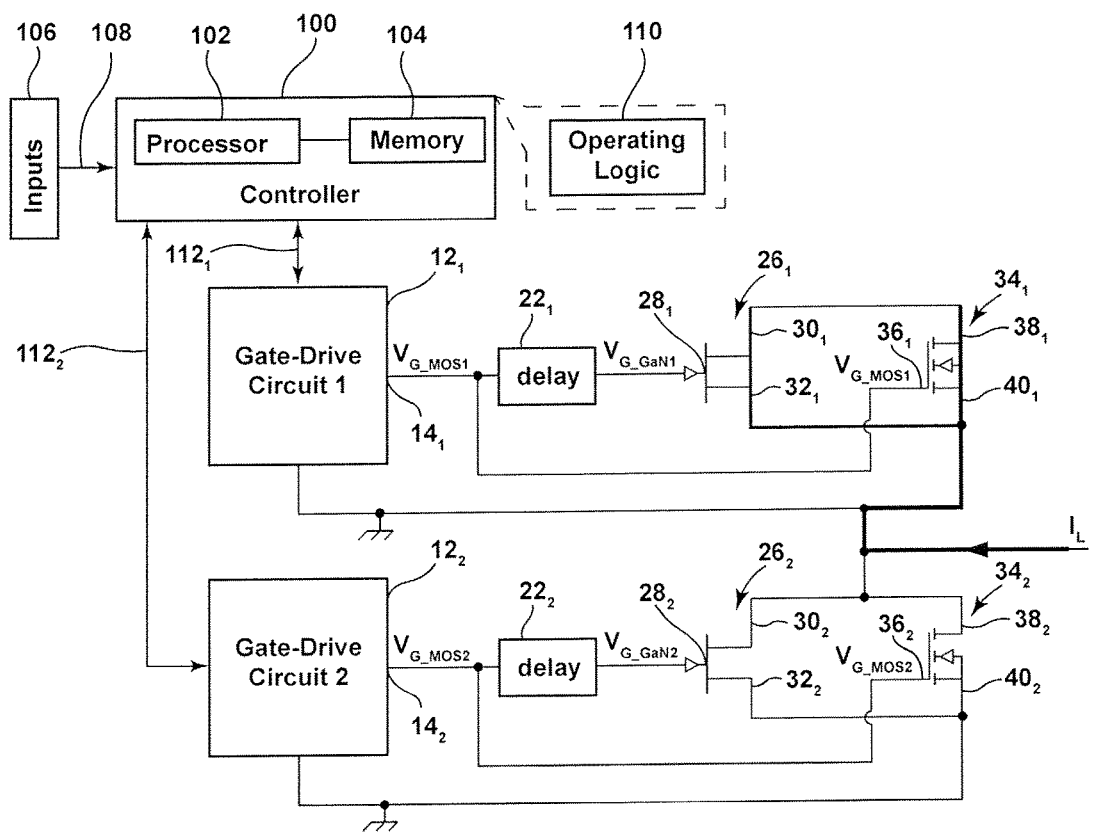
Figure 9:
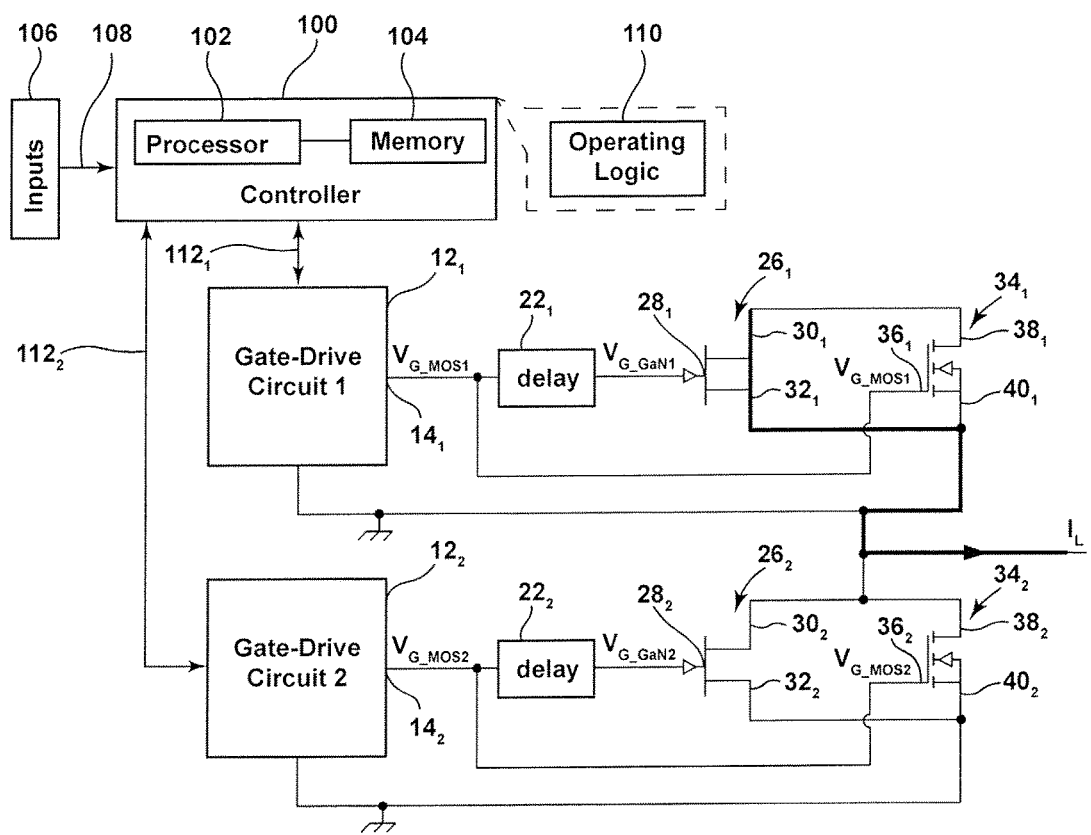

Mode 3: [$t_2$, $t_3$]. During the time period between times $t_2$, $t_3$, both the upper GaN HEMT $26_1$ and the Si MOSFET $34_1$ are on, while the lower switches remain off (i.e., the lower switches $26_2$, $34_2$ remain off). This is because the turn-on delay inserted by the delay block 22 has passed and thus both the upper gate drive and upper delayed gate drive signals $16_1$, $24_1$ ($V_{G\_MOS1}$, $V_{G\_GaN1}$) are both asserted and in the ON state, while the lower gate drive and lower delayed gate drive signals $16_2$, $24_2$ ($V_{G\_MOS2}$, $V_{G\_GaN2}$) are de-asserted and in the OFF state. In an embodiment, the MOSFET channel resistance can be made to be much smaller than that of the GaN HEMT by paralleling further Si MOSFETs (not shown), which is relatively affordable. Accordingly, as shown in FIG. 8, most of the current $I_L$ will still flow through Si MOSFET $34_1$ channel, although a smaller portion of the current $I_L$ will flow through the GaN HEMT $26_1$. Accordingly, in modes 1-3 operation, a reverse conduction loss through the GaN HEMT $26_1$ that might have been occurred if the GaN HEMT $26_1$ were used alone is thus avoided.

Mode 4: [$t_3$, $t_4$]. During the time period between times $t_3$, $t_4$, the upper GaN HEMT $26_1$ is ON and the upper Si MOSFET $34_1$ is OFF, while the lower switches also remain off (i.e., the lower switches $26_2$, $34_2$ remain off). This is because (i) notwithstanding the de-assertion of the gate drive signal $16_1$ ($V_{G\_MOS1}$) to turn OFF the "upper" Si MOSFET, the delay block 22 has time delayed the corresponding de-assertion of the gate drive signal $24_1$ ($V_{G\_GaN1}$) controlling the upper GaN HEMT $26_1$. Also, the gate drive signals $16_2$, $24_2$ ($V_{G\_MOS2}$, $V_{G\_GaN2}$) are both de-asserted and thus in the OFF state. In sum, all switches are off except the upper GaN HEMT $26_1$. To realize ZVS for the lower hybrid switch arrangement, during this period, the polarity of the electrical current $I_L$ should be reversed, shown in FIG. 9. It should be appreciated that when the upper Si MOSFET $34_1$ is turned off by de-assertion of gate drive signal $16_1$ ($V_{G\_MOS1}$) that the GaN HEMT $26_1$ is still on, by virtue of the time delay inserted by delay block 22. As a consequence, therefore, the Si MOSFET $34_1$ is ZVS turned off. There is no switching-off loss for the upper Si MOSFET $34_1$.

In addition, although the upper GaN HEMT $26_1$ is hard turned off at $t=t_4$, experimental results show that the GaN HEMT $26_1$ turn off is ignorable. More specifically, compared to the hard turn-on loss, the above-mentioned hard turn-off loss is much smaller. Therefore, embodiments consistent with the teachings of the present disclosure are able to run at a much higher switching frequency, since the Si MOSFET switching loss is zero.

Mode 5: [t₄, t₅]. During the time period between times t₄, t₅, all of the switches are off (i.e., switches 26₁, 34₁, 26₂, 34₂). This is because all the gate drive signals are de-asserted and are in the OFF state. Again, similar to mode 1, since the body diode of the lower Si MOSFET 34₂ exhibits a much lower voltage drop than that of the GaN HEMT 26₂, the current $I_L$ will go through body diode of lower MOSFET 34₂ instead, which exhibits about a 1~2V voltage drop only.

Figure 10:
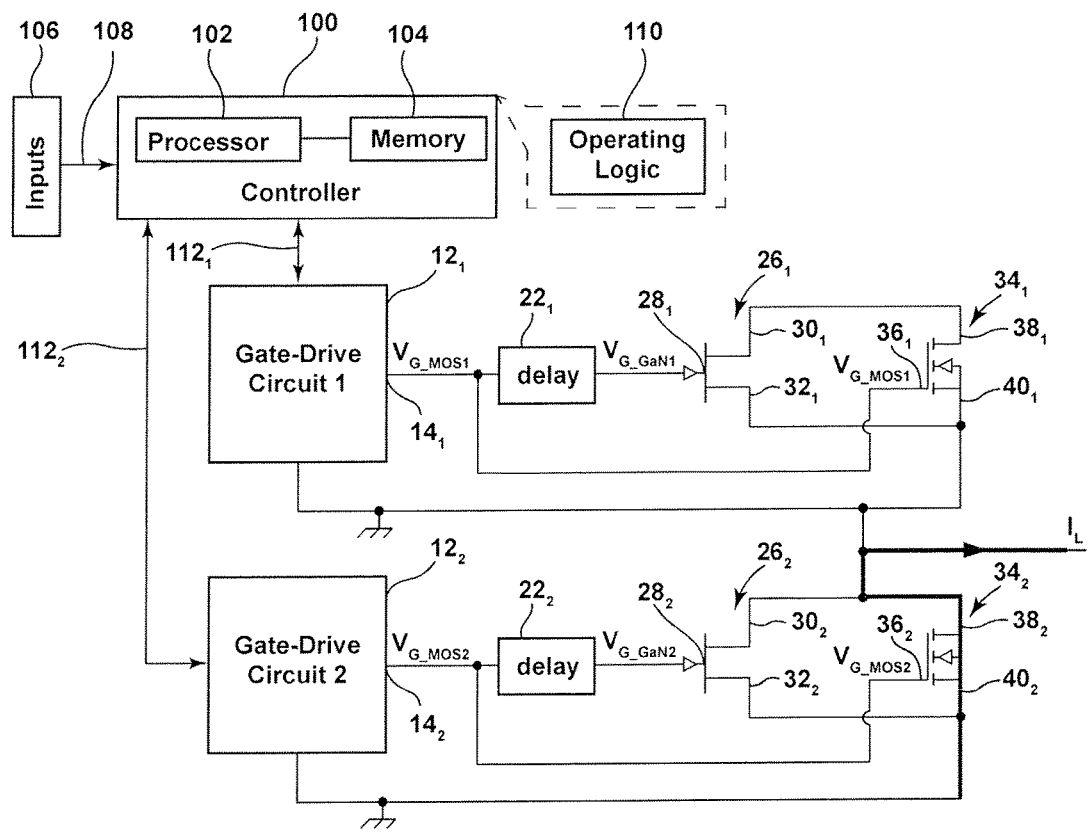

Mode 6: [t₅, t₆]. During the time period between times t₅, t₆, the lower Si MOSFET 34₂ is on, while the other switches remain off (i.e., the other switches 26₁, 26₂, 34₁ remain off). This is because (i) notwithstanding the assertion of the gate drive signal 16₂ ($V_{G\_MOS1}$), the delay block 22 has time delayed the corresponding assertion of the gate drive signal 24₂ ($V_{G\_GaN2}$); and (ii) the gate drive signals 16₁, 24₁ ($V_{G\_MOS1}$, $V_{G\_GaN1}$) are also both in the OFF state. Similar to mode 2 above, the current $I_L$ will flow through the lower Si MOSFET 34₂ channel, as shown in FIG. 10. Since the GaN HEMT 26₂ exhibits a roughly 7V drop in this example (see above in connection with Equation (1))—as compared to the much smaller voltage drop across the channel of the Si MOSFET 34₂ (i.e., the MOSFET channel voltage drop is much smaller due to a small resistance—is ~mΩ), the current $I_L$ will flow through the lower Si MOSFET 34₂ channel. In sum, the lower Si MOSFET is ON, which makes all current go through its channel. At time t=t₆, the lower GaN HEMT 16₂ is ZVS ON—this occurs after the time delay inserted by the delay block has passed.

Therefore, in summary, the following features of an embodiment of the hybrid switch apparatus of FIGS. 4-10 can be described. First, there is no current going through GaN HEMTs when all of the switches are OFF. Therefore, the relatively large reverse conduction loss can be avoided for GaN HEMTs. Second, all the Si MOSFETs are turned off when the GaN HEMTs are still on. Therefore, there is no switching off loss for the Si MOSFETs. Third, all the switches are ZVS turned-on. Therefore, all the Si MOSFETs do not have any switching loss but only at most conduction losses. Fourth, all the GaN HEMTs will only undertake the switching off loss with very little forward/reverse conduction loss and zero switching on loss. Therefore, all the conduction loss is undertaken by the Si MOSFETs. All the switching off losses are undertaken by the GaN HEMTs. The foregoing described hybrid switch apparatus fully utilizes the advantages of both the Si MOSFET devices as well as the GaN HEMT devices.

It should be understood that an electronic control unit as described herein may include conventional processing apparatus known in the art, capable of executing pre-programmed instructions stored in an associated memory, all performing in accordance with the functionality described herein. To the extent that the methods described herein are embodied in software, the resulting software can be stored in an associated memory and can also constitute the means for performing such methods. Implementation of certain embodiments, where done so in software, would require no more than routine application of programming skills by one of ordinary skill in the art, in view of the foregoing enabling description. Such an electronic control unit may further be of the type having both ROM, RAM, a combination of non-volatile and volatile (modifiable) memory so that any software may be stored and yet allow storage and processing of dynamically produced data and/or signals.

Although only certain embodiments have been described above with a certain degree of particularity, those skilled in the art could make numerous alterations to the disclosed embodiments without departing from the scope of this disclosure. It is intended that all matter contained in the above description or shown in the accompanying drawings shall be interpreted as illustrative only and not limiting. Changes in detail or structure may be made without departing from the invention as defined in the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

While one or more particular embodiments have been shown and described, it will be understood by those of skill in the art that various changes and modifications can be made without departing from the spirit and scope of the present teachings.

What is claimed is:

1. An apparatus comprising:
   a gate drive circuit for producing a first gate drive signal on a first gate drive output wherein said first gate drive signal comprises an ON state and an OFF state;
   a first semiconductor switching device having a first gate, a first drain, and a first source;
   a second semiconductor switching device having a second gate, a second drain, and a second source, said second semiconductor switching device having a first turn-on time that is less than a second turn-on time associated with said first semiconductor switching device;
   said first and second semiconductor switching devices being connected in a parallel arrangement wherein (i) said first drain and said second drain are electrically connected and (ii) said first source and said second source are electrically connected, wherein said first gate of said first semiconductor switching device is connected to said first gate drive output of said gate drive circuit to receive said first gate drive signal; and
   a pulse former external to said gate drive circuit and coupled between said gate drive output and said second gate of said second semiconductor switching device for receiving said first gate drive signal and producing a second gate drive signal comprising a first pulse and a second pulse, said pulse former being configured to generate:
   (i) said first pulse in response to said first gate drive signal transitioning from said OFF state to said ON state, wherein a rising edge of said first pulse is synchronous with, and not prior to, said first gate drive signal transitioning to said ON state, and
   (ii) said second pulse in response to said first gate drive signal transitioning from said ON state to said OFF state, wherein a rising edge of said second pulse is synchronous with, and not prior to, said first gate drive signal transitioning to said OFF state, and
   wherein said second gate drive signal is in an OFF state between said first and second pulses.

2. The apparatus of claim 1 wherein said second switching device comprises a wide-bandgap (WBG) device including a GaN high electron mobility transistor (HEMT) device, a GaN cascode device, a SiC device, or a GaN based switching device.

3. The apparatus of claim 1 wherein said first semiconductor switching device comprises a silicon (Si) MOSFET device.

4. The apparatus of claim 3 wherein said Si MOSFET device comprises a body diode between said first source and said first drain.

5. The apparatus of claim 1 wherein said first pulse has a first duration and said second pulse has a second duration.

6. The apparatus of claim 5 wherein said first and second durations are equal.

7. The apparatus of claim 5 wherein said first and second durations are unequal.

8. The apparatus of claim 1 wherein a first power handling capability of said first semiconductor switch is greater than a second power handling capability of said second semiconductor switch.

9. The apparatus of claim 1 wherein said OFF state of said second gate drive signal in between said first and second pulses reduces a conduction power loss of said second semiconductor switching device.

10. The apparatus of claim 1 further comprising respective resistors coupled to said first and second control inputs and through which said first and second gate drive signals pass.

* * * * *